United States Patent [19]
Ando

[11] Patent Number: 5,949,285
[45] Date of Patent: Sep. 7, 1999

[54] GAIN-VARIABLE AMPLIFIER HAVING SMALL DC OUTPUT DEVIATION AND SMALL DISTORTION

[75] Inventor: Yoshiaki Ando, Tokyo, Japan

[73] Assignee: NEC Corporation, Tokyo, Japan

[21] Appl. No.: 08/869,909

[22] Filed: Jun. 5, 1997

[30] Foreign Application Priority Data

Jun. 7, 1996 [JP] Japan ..................................... 8-168292

[51] Int. Cl.⁶ .................................................... H03F 3/45
[52] U.S. Cl. ............................................. 330/254; 327/359
[58] Field of Search ........................... 330/254; 327/359; 332/178; 455/323, 333

[56] References Cited

FOREIGN PATENT DOCUMENTS

| 152109 | 7/1986 | Japan | ..................................... 330/254 |
| 61-152109 | 7/1986 | Japan . | |
| 61-157015 | 7/1986 | Japan . | |
| 2-301307 | 12/1990 | Japan . | |
| 3-32209 | 2/1991 | Japan . | |
| 5-63472 | 3/1993 | Japan . | |

*Primary Examiner*—Robert Pascal
*Assistant Examiner*—Khanh Van Nguyen
*Attorney, Agent, or Firm*—Young & Thompson

[57] ABSTRACT

In a gain-variable amplifier, a first differential amplifier is formed by first and second transistors having a common emitter connected to a first constant current source, a second differential amplifier is formed by third and fourth transistors having a common emitter connected to a collector of the second transistor, and a third differential amplifier is formed by fifth and sixth transistors having a common emitter. Collectors of the fifth and sixth transistors are connected to collectors of the third and fourth transistors, respectively. A seventh transistor is connected between the common emitter of the fifth and sixth transistors and a second constant current source.

21 Claims, 13 Drawing Sheets

GAIN-VARIABLE AMPLIFIER HAVING SMALL DC OUTPUT DEVIATION AND SMALL DISTORTION

BACKGROUND OF THE INVENTION

1. Field of the Invention

The present invention relates to a gain-variable amplifier used as an automatic gain control (AGC) circuit or the like.

2. Description of the Related Art

A first prior art gain-variable amplifier includes a first differential amplifier formed by first and second transistors having a common emitter connected a constant current source, a second differential amplifier formed by third and fourth transistors connected to the collector of the second transistor, and a third differential amplifier formed by fifth and sixth transistors having a common emitter connected to the collector of the first transistor. The first differential amplifier receives an input voltage. Also, the collectors of the third and fourth transistors are connected to the fifth and sixth transistors, respectively. The second and third differential amplifiers are controlled by a gain control voltage. This will be explained later in detail.

In the first prior art gain-variable amplifier, since the gain characteristics have an inflection point, it is difficult to control the gain by the gain control voltage. Also, the phase of the output voltage $V_{out}$ is inverted at the inflection point. Since only half of the exploitable range of the gain control voltage is utilized, the range of the gain control voltage is substantially reduced.

A second prior art gain-variable amplifier includes a first differential amplifier formed by first and second transistors having a common emitter connected to a first constant current source, a second differential amplifier formed by third and fourth transistors connected to the collector of the second transistor, and a third differential amplifier formed by fifth and sixth transistors having a common emitter connected to a second constant current source. Also, in this case, the first differential amplifier receives an input voltage. Also, the collectors of the third and fourth transistors are connected to the fifth and sixth transistors, respectively. The second and third differential amplifiers are controlled by a gain control voltage. This will be explained later in detail (see JP-A-3-32209).

In the second prior art gain-variable amplifier, since the gain characteristics have no inflection point, it is easy to control the gain by the gain control voltage. Also, the phase of the output voltage is never inverted. Since a full range of the exploitable range of the gain control voltage is utilized, the range of the gain control voltage is substantially increased.

In the second prior art gain-variable amplifier, the deviation of the DC component of the output voltage depending upon the gain control voltage is large. This large deviation can become enormous in the manufacture of an integrated circuit due to deviations in the current amplification factor.

Further, a signal may be subjected to distortion and degradation due to the difference in collector-emitter voltage between the first and second transistors. For example, in a radio transmitter/receiver sets, the distortion appears as harmonic distortion of a transmitting/receiving frequency which degrades the operating characteristics.

SUMMARY OF THE INVENTION

It is an object of the present invention to reduce the deviation of the DC component of an output voltage and the signal distortion in a gain-variable amplifier.

According to the present invention, in a gain-variable amplifier, a first differential amplifier is formed by first and second transistors having a common emitter connected to a first constant current source, a second differential amplifier is formed by third and fourth transistors having a common emitter connected to a collector of the second transistor, and a third differential amplifier is formed by fifth and sixth transistors having a common emitter. Collectors of the fifth and sixth transistors are connected to collectors of the third and fourth transistors, respectively.

A seventh transistor is connected between the common emitter of the fifth and sixth transistors and a second constant current source.

Also, an eighth transistor is connected to the collector of the first transistor.

BRIEF DESCRIPTION OF THE DRAWINGS

The present invention will be more clearly understood from the description as set forth below, with reference to the accompanying drawings, wherein.

DESCRIPTION OF THE PREFERRED EMBODIMENTS

Before the description of the preferred embodiments, prior art gain-variable amplifiers will be explained with reference to FIGS. 1, 2, 3 and 4.

Figure 1:
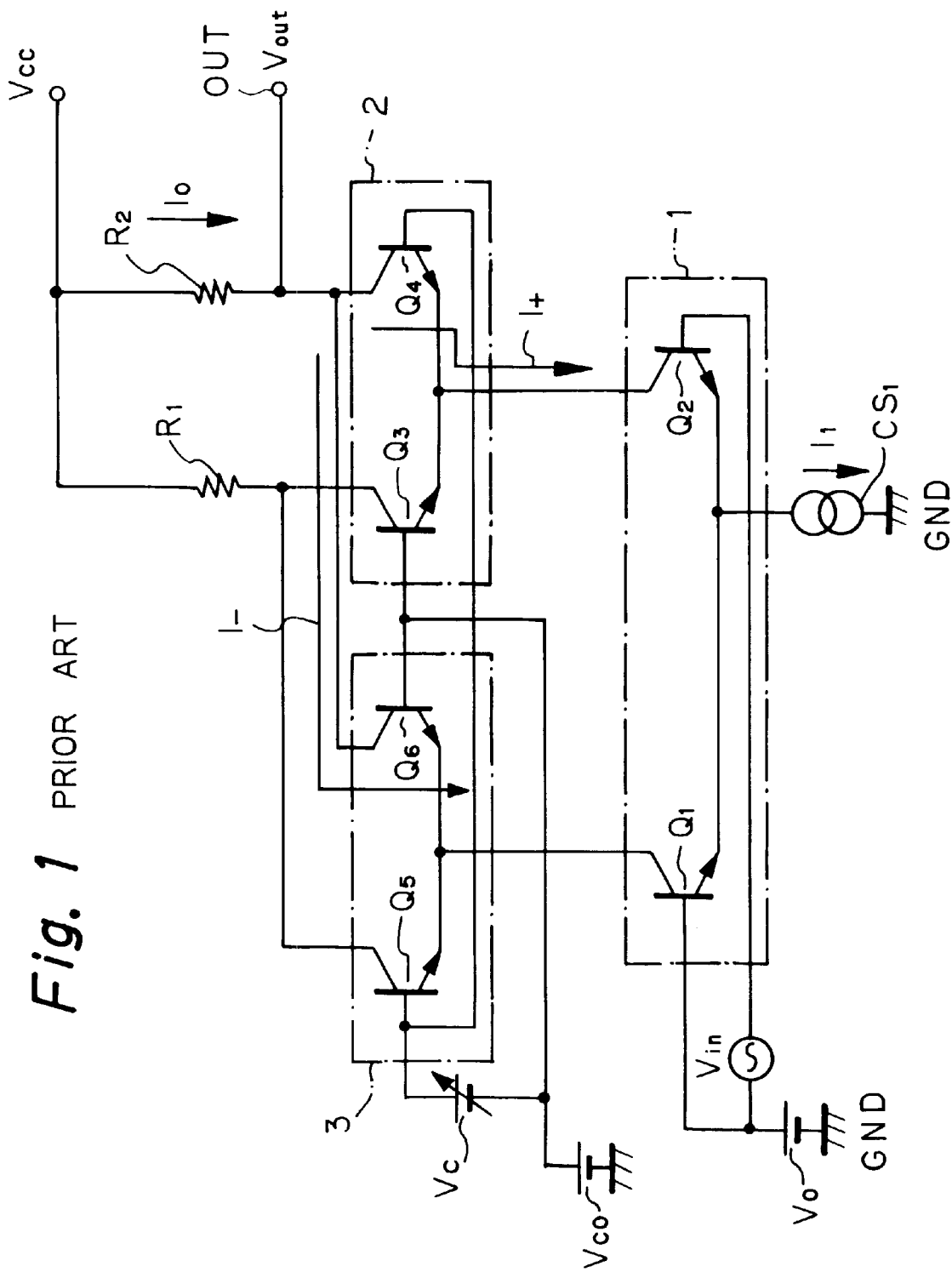
FIG. 1 is a circuit diagram illustrating a first prior art gain-variable amplifier.

In FIG. 1, which illustrates a first prior art gain-variable amplifier, a differential amplifier 1 is formed by two NPN type transistors $Q_1$ and $Q_2$ having a common emitter connected via a constant current source $IS_1$ whose current is $I_1$, to a ground terminal GND. An AC input voltage $V_{in}$ is applied between bases of the transistors $Q_1$ and $Q_2$.

The differential amplifier 1 amplifiers the input voltage $V_{in}$.

Also, a differential amplifier 2 is formed by two NPN type transistors $Q_3$ and $Q_4$ having a common emitter connected to the collector of the transistor $Q_2$ of the differential amplifier 1. Similarly, a differential amplifier 3 is formed by two NPN type transistors $Q_5$ and $Q_6$ having a common emitter connected to the collector of the transistor $Q_1$ of the differential amplifier 1.

The collectors of the transistors $Q_3$ and $Q_4$ are connected by way of a load resistor $R_1$ to a power supply terminal $V_{CC}$, while the collectors of the transistors $Q_5$ and $Q_6$ are connected by way of a load resistor $R_2$ to the power supply terminal $V_{CC}$.

Note that the AC input voltage $V_{in}$, is biased by a DC voltage $V_0$. Also, a DC bias voltage $V_{C0}$ is applied to the bases of the transistors $Q_3$ and $Q_6$, and a gain control voltage $V_C$ is applied to the bases of the transistors $Q_4$ and $Q_5$.

The load resistor $R_2$ provides an output voltage $V_{out}$ at an output terminal OUT. In this case, a current $I_0$ flowing through the resistor $R_2$ is formed by a positive phase current $I_+$ flowing through the transistor $Q_4$ of the differential amplifier 2 and the transistor $Q_2$ of the differential amplifier 1 and a negative phase current $I_-$ flowing through the transistor $Q_6$ of the differential amplifier 3 and the transistor $Q_1$ of the differential amplifier 1.

Figure 2:
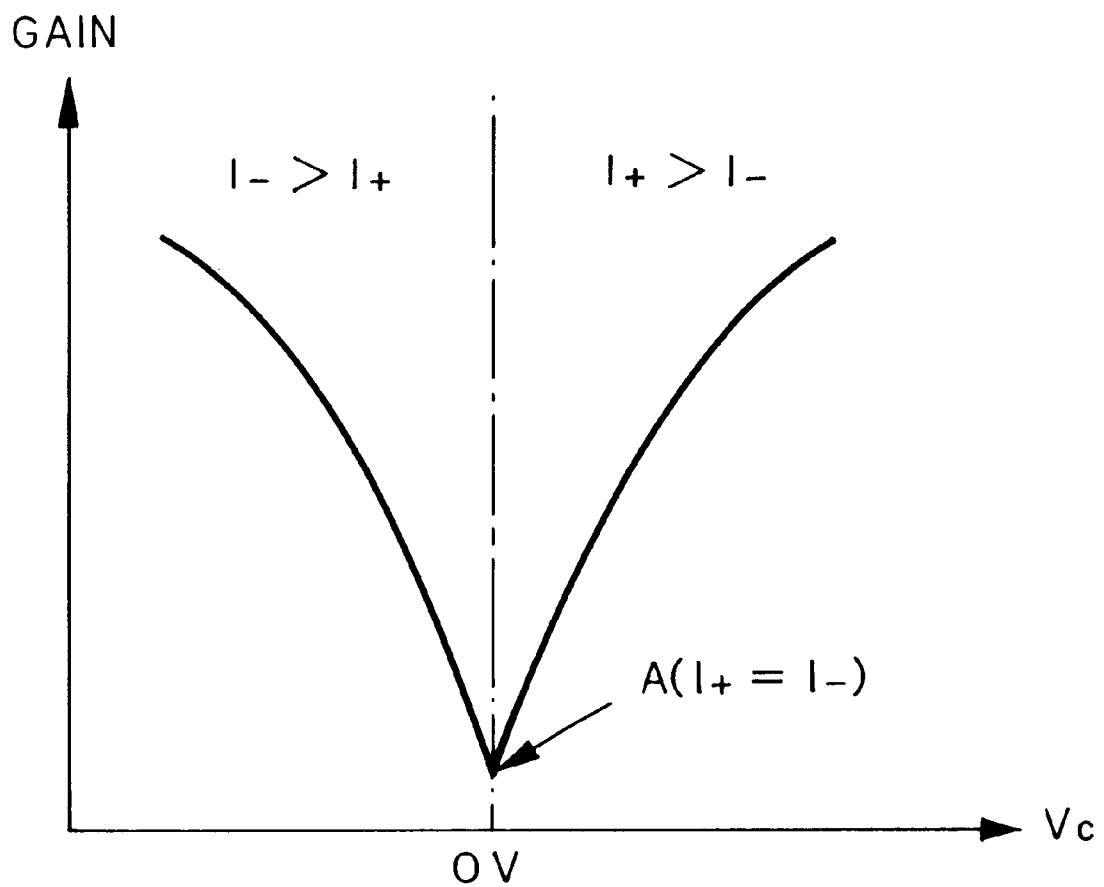
FIG. 2 is a graph showing the gain characteristics of the gain-variable amplifier of FIG. 1.

In FIG. 1, when the gain control voltage $V_C$ is positive, the positive phase current $I_+$ is greater than the negative phase current $I_-$. In this case, the higher the gain control voltage $V_C$, the larger the positive phase current $I_+$. As a result, as shown in FIG. 2, the gain is increased as the gain control voltage $V_C$ is increased. On the other hand, when the gain control voltage $V_C$ is negative, the negative phase current $I_-$ is greater than the positive phase current $I_+$. In this case, the lower the gain control voltage $V_C$, the larger the negative phase current $I_-$. As a result, as shown in FIG. 2, the gain is increased as the gain control voltage $V_C$ is decreased. In addition, if $V_C=0V$, the voltage at the bases of the transistors $Q_3$ and $Q_6$ is equal to the voltage at the bases of the transistors $Q_4$ and $Q_5$. Therefore, the positive phase current I+ is equal to the negative phase current I_. In this case, the positive phase current $I_-$ offsets the negative phase current $I_-$, so that the output voltage $V_{OUT}$ includes only a DC component. As a result, as indicated by A in FIG. 2, the gain of the gain-variable amplifier of FIG. 1 is minimum.

In the gain-variable amplifier of FIG. 1, since the gain characteristics have an inflection point as indicated by A in FIG. 2, it is difficult to control the gain by the gain control voltage $V_C$. Also, the phase of the output voltage $V_{out}$ is inverted at the inflection point A. Since only half of the exploitable range of the gain control voltage $V_C$ is utilized, the range of the gain control voltage $V_C$ is substantially reduced.

The DC voltage of the output voltage $V_{out}$ is explained next. Here, all the transistors $Q_1$ to $Q_6$ have the same characteristics.

First, assume that $V_{in}=0V$ and $V_C$=Maximum value. For example, $V_C=V_{CC}-V_{C0}$. Here, collector currents of the transistors $Q_2$, $Q_4$ and $Q_6$ are denoted by $I_{C2}$, $I_{C4}$ and $I_{C4}$, respectively, and the base currents of the transistors $Q_2$, $Q_4$ and $Q_6$ are denoted by $I_{B2}$, $I_{B4}$ and $I_{B6}$, respectively. In this case, the transistors $Q_4$ and $Q_6$ are turned ON and OFF, respectively, so that $$I_{C6} \approx 0$$

$$I_0 \approx I_{C4} \tag{1}$$

Therefore, $$V_{out} = V_{CC} - I_0 \cdot R_2 \tag{2}$$
$$= V_{CC} - (I_{C4} + I_{C6}) \cdot R_2$$
$$\approx V_{CC} - I_{C4} \cdot R_2$$

Also, in the transistor $Q_2$, $$I_1/2 = I_{C2} + I_{B2} \tag{3}$$

Further, in the transistor $Q_4$, $$I_{C2} = I_{C4} + I_{B4} \tag{4}$$

From the formulae (2), (3) and (4), $$V_{out} = V_{CC} - (I_1/2 - I_{B2} - I_{B4}) \cdot R_2 \tag{5}$$

Next, assume that $V_{in}=0V$ and $V_C$=Minimum value such as 0V (see FIG. 2). Here, collector currents of the transistors $Q_2$, $Q_4$ and $Q_6$ are denoted by $I_2'$, $I_{C4}'$ and $I_{C4}'$, respectively, and the base currents of the transistors $Q_2$, $Q_4$ and $Q_6$ are denoted by $I_{B2}'$, $I_{B4}'$ and $I_{B6}'$, respectively. In this case, $$V_{out}' = V_{CC} - (I_{C4}' + I_{C6}') \cdot R_2 \tag{6}$$
$$= V_{CC} - \{(I_1/2 - I_{B2}')/2 - I_{B4}' + (I_1/2 - I_{B1}')/2 - I_{B6}'\} \cdot R_2$$
$$= V_{CC} - (I_1/2 - I_{B2}' - 2I_{B4}') \cdot R_2$$

Thus, since $I_{B2}=I_{B2}'$, the difference $\Delta V$ between $V_{out}$ and $V_{out}'$ of the formulae (5) and (6) is calculated by $$\Delta V = (2I_{B4}' - I_{B4}) \cdot R_2 \tag{7}$$

Note that, since $I_{B4}=I_{B4}'/2$ can be satisfied, $$\Delta V = 0$$

Thus, in the gain-variable amplifier of FIG. 1, the deviation of the DC component or the output voltage $V_{out}$ depending upon the gain control voltage $V_C$ is small.

Figure 3:
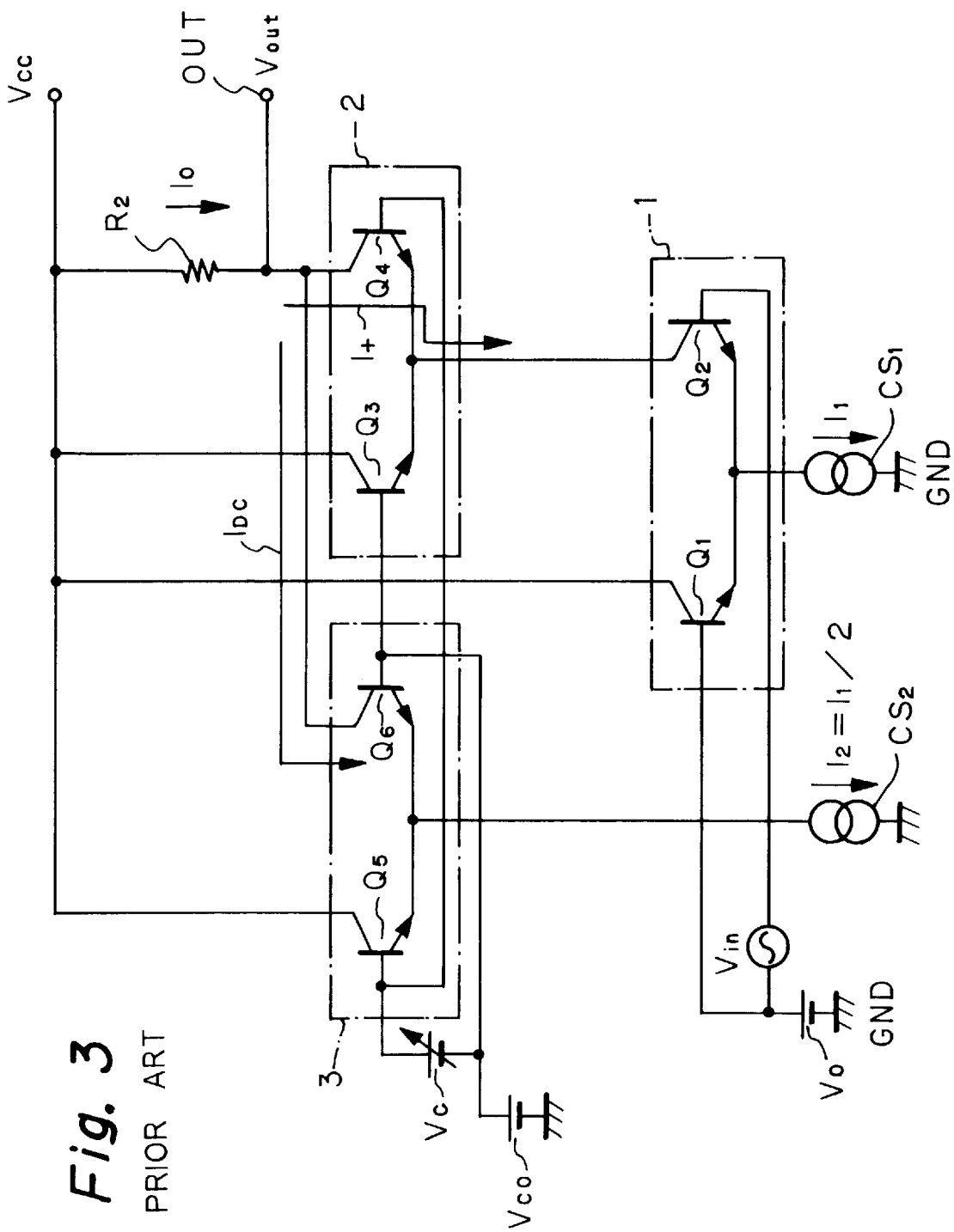
FIG. 3 is a circuit diagram illustrating a second prior art gain-variable amplifier.

In FIG. 3, which illustrates a second prior art gain-variable amplifier (see JP-A-3-32209), the resistor $R_1$ of FIG. 1 is not present. Also, the collectors of the transistors $Q_1$, $Q_3$ and $Q_5$ of FIG. 1 are connected directly to the power supply terminal $V_{CC}$. The common emitter of the transistors $Q_5$ and $Q_6$ of FIG. 1 are connected via a constant current source $CS_2$ whose current is $I_2$, to the ground terminal GND. Note that tile current ratio of $I_1$ to $I_2$ is 2.

The load resistor $R_2$ also provides the output voltage $V_{out}$ at the output terminal OUT. In this case, the current $I_0$ flowing through the resistor $R_2$ is formed by a positive phase current $I_+$ flowing through the transistor $Q_4$ of the differential amplifier 2 and the transistor $Q_2$ of the differential amplifier 1 and a DC current $I_{DC}$ flowing through the transistor $Q_6$ of the differential amplifier 3 and the transistor $Q_1$ of the differential amplifier 1.

Figure 4:
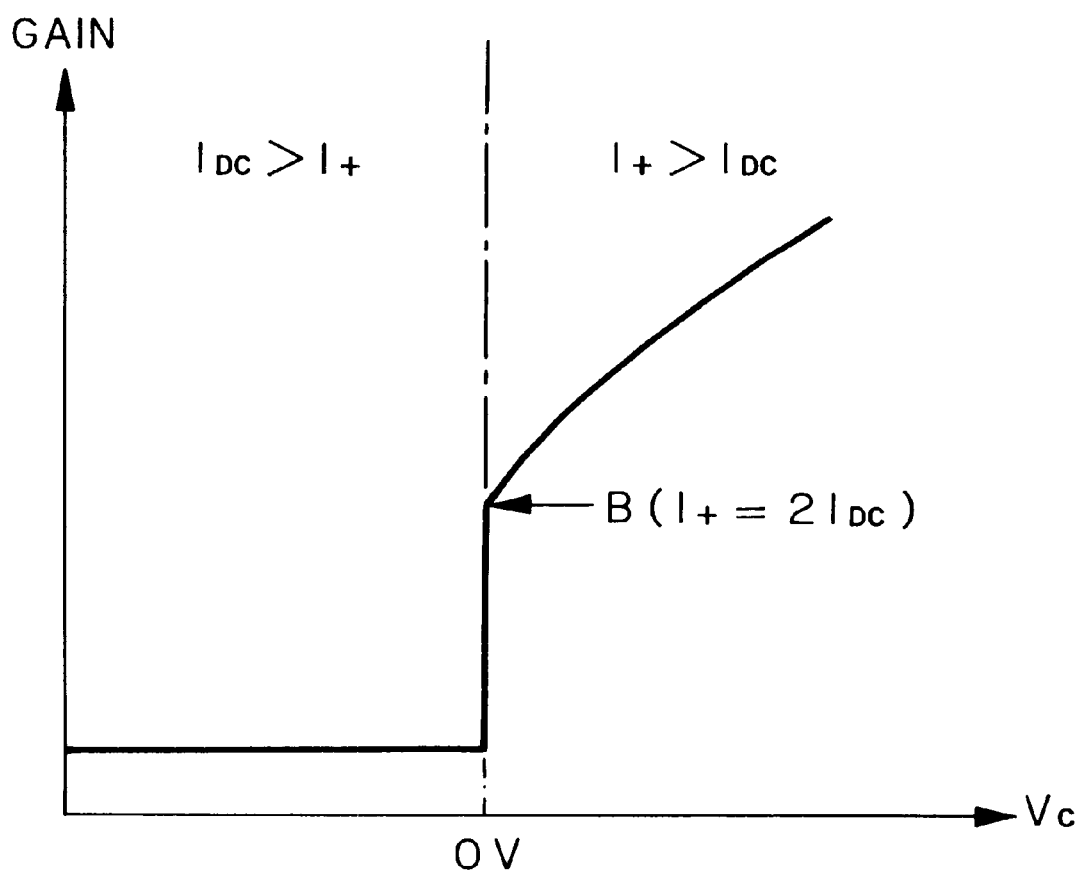
FIG. 4 is a graph showing the gain characteristics of the gain-variable amplifier of FIG. 3.

In FIG. 3, when the gain control voltage $V_C$ is positive, the positive phase current $I_+$ is greater than the DC current $I_{DC}$. In this case, tie higher the gain control voltage $V_C$, the larger the positive phase current $I_+$. As a result, as shown in FIG. 4, the gain is increased as the gain control voltage $V_C$ is increased. Also, if $V_C=0V$, the voltage at the bases of the transistors $Q_3$ and $Q_6$ is equal to the voltage at the bases of the transistors $Q_4$ and $Q_9$. Therefore, since the current ratio of $I_1$ to $I_2$ is 2, the positive phase current $I_+$ is twice the DC current $I_{DC}$. As a result, as indicated by B in FIG. 4, the gain of the gain-variable amplifier of FIG. 3 is about half of the maximum gain.

On the other hand, when the gain control voltage $V_C$ is negative, the DC current $I_{DC}$ is greater than the positive phase current $I_+$. That is, the output voltage $V_{out}$ includes only a DC component. As a result, as shown in FIG. 4, the gain of the gain-variable amplifier of FIG. 3 is minimum.

In the gain-variable amplifier of FIG. 3, since the gain characteristics have no inflection point as shown in FIG. 4, it is easy to control the gain by the gain control voltage $V_C$ from a negative value to a positive value. Also, the phase of the output voltage $V_{out}$ is never inverted. Since a full range of the exploitable range of the gain control voltage $V_C$ is utilized, the range of the gain control voltage $V_C$ is substantially increased.

The DC voltage of the output voltage $V_{out}$ is explained next. Here, all the transistors $Q_1$ to $Q_6$ have the same characteristics.

First, assume that $V_{in}=0V$ and $V_C$=Maximum value. For example, $V_C=V_{CC}-V_{C0}$. Here, collector currents of the transistors $Q_2$, $Q_4$ and $Q_6$ are denoted by $I_{C2}$, $I_{C4}$ and $I_{C4}$, respectively, and the base currents of the transistors $Q_2$, $Q_4$ and $Q_6$ are denoted by $I_{B2}$, $I_{B4}$ and $I_{B6}$, respectively. In this case, $$V_{out}=V_{CC}-(I_{C4}+I_{C6})\cdot R_2 = V_{CC}-(I_1/2-I_{B4})\cdot R_2 \quad (8)$$

Next, assume that $V_{in}=0V$ and $V_C$=Minimum value such as $-(V_{CC}-V_{C0})$ (see FIG. 4). Here, collector currents of the transistors $Q_2$, $Q_4$ and $Q_6$ are denoted by $I_{C2}'$, $I_{C4}'$ and $I_{C4}'$, respectively, and the base currents of the transistors $Q_2$, $Q_4$ and $Q_6$ are denoted by $I_{B2}'$, $I_{B4}'$ and $I_{B6}'$, respectively. In this case, $$V_{out}' = V_{CC} - (I_{C4}' + I_{C6}')\cdot R_2 \quad (9)$$
$$= V_{CC} - (I_1/2 - I_{B6}')\cdot R_2$$

Thus, since $I_{B2}=I_{B2}'$, the difference $\Delta V$ between $V_{out}$ and $V_{out}'$ of the formulae (8) and (9) is calculated by $$\Delta V = (I_{B6}'-I_{B2}'-I_{B4})\cdot R_2 \quad (10)$$

Note that, since $I_{B4}'=I_{E6}'$ can be satisfied, $$\Delta V = -I_{B2}\cdot R_2$$

Thus, in the gain-variable amplifier of FIG. 3, the deviation of the DC component of the output voltage $V_{out}$ depending upon the gain control voltage $V_C$ is large. This large deviation can become enormous in the manufacture of integrated circuits due to deviations in the current amplification factor. Particularly, in radio transmitter/receiver sets, the large deviation of the output DC voltage can be amplified by the downstream amplifiers which degrades various operating characteristics of the sets.

Further, in FIG. 3, the signal is subjected to distortion and degradation due to the difference in collector-emitter voltage $V_{CE}$ ($V_{CE1}>V_{CE2}$) between the transistors $Q_1$ and $Q_2$. For example, in radio transmitter/receiver sets, the distortion appears as harmonic distortion of a transmitting/receiving frequency which degrades the operating characteristics.

Figure 5:
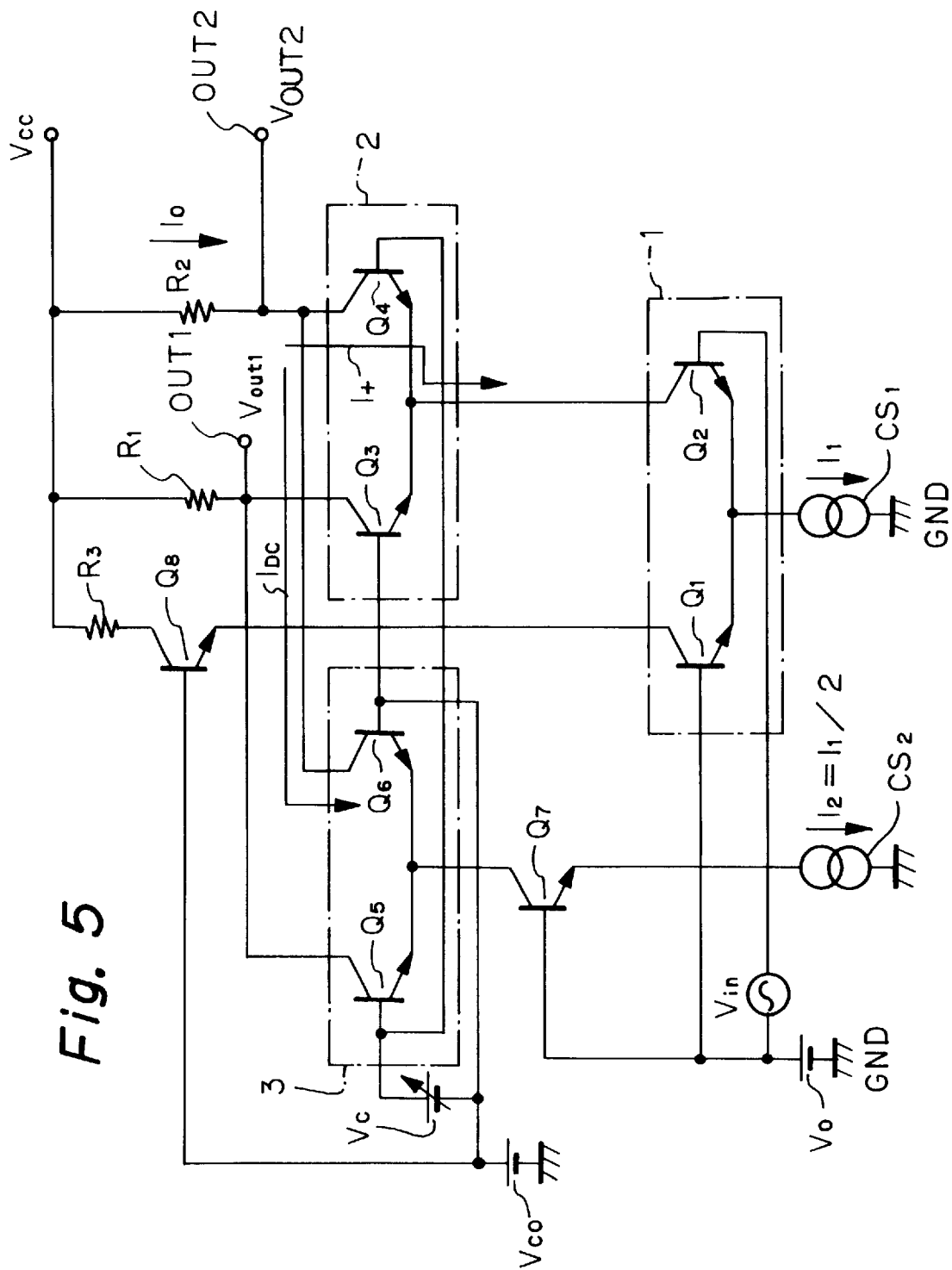
FIG. 5 is a circuit diagram illustrating a first embodiment of the gain-variable amplifier according to the present invention.

In FIG. 5, which illustrates a first embodiment of the present invention, an NPN type transistor $Q_7$ is interposed between the common emitter of the transistors $Q_5$ and $Q_6$ and the constant current source $CS_2$ of FIG. 3. Since the base of the transistor $Q_7$ is connected to the base of the transistor $Q_1$, the transistor $Q_7$ corresponds to the transistor $Q_1$. Also, a load resistor $R_1$ is interposed between the power supply terminal $V_{CC}$ and the collector of the transistor $Q_3$ of FIG. 3. The load resistor $R_1$ provides a negative phase output voltage $V_{out\ 1}$ at an output terminal OUT1, while the load resistor $R_2$ provides a positive phase output voltage $V_{out2}$ at an output terminal OUT2.

Further, a load resistor $R_3$ and an NPN type transistor $Q_8$ are connected in series between the power supply terminal $V_{CC}$ and the collector of the transistor $Q_1$ of FIG. 3. Since the base of the transistor $Q_8$ is connected to the bases of the transistors $Q_3$ and $Q_6$, the load resistor $R_3$ and the transistor $Q_3$ correspond to the load resistor $R_1$ and the transistor $Q_3$ (or $Q_6$), respectively.

The gain characteristics of the gain-variable amplifier of FIG. 5 are the same as those of the gain-variable amplifier of FIG. 3 as shown in FIG. 4. Here, collector currents of the transistors $Q_2$, $Q_4$, $Q_6$ and $Q_7$ are denoted by $I_{C2}$, $I_{C4}$, $I_{C6}$ and $I_{C7}$, respectively, and the base currents of the transistors $Q_2$, $Q_4$, $Q_6$ and $Q_7$ are denoted by $I_{B2}$, $I_{B4}$, $I_{B6}$ and $I_{B7}$, respectively. Also, in this case, $$V_{out2} = V_{CC} - (I_{C4} + I_{C6})\cdot R_2 \quad (11)$$
$$= V_{CC} - (I_1/2 - I_{B2} - I_{B4})\cdot R_2$$

Next, assume that $V_{in}=0V$ and $V_C$=Minimum value such as $-(V_{CC}-V_{C0})$ (see FIG. 4). Here, collector currents of the transistors $Q_2$, $Q_4$, $Q_6$ and $Q_7$ are denoted by $I_{C2}'$, $I_{C4}'$, $I_{C6}'$ and $I_{C7}'$, respectively, and the base currents of the transistors $Q_2$, $Q_4$, $Q_6$ and $Q_7$ are denoted by $I_{B2}'$, $I_{B4}'$, $I_{B6}'$ and $I_{B7}'$, respectively. In this case, $$V_{out2}'=V_{CC}-(I_{C4}'+I_{C6}')\cdot R_2 \quad (12)$$

Since $I_{C4}'=I_1/2-I_{B4}'$ and $I_{C6}'=I_1/2-I_{B7}'-I_{B6}'(I_{B4}=I_{B6}')$, $$V_{out2}'=V_{CC}-(I_1/2-I_{B6}-I_{B7}')\cdot R_2 \quad (13)$$

Therefore, the difference $\Delta V$ between $V_{out2}$ and $V_{out2}'$ of the formulae (11) and (13) is calculated by $$\Delta V=(I_{B6}'+I_{B7}'-I_{B2}-I_{B4})\cdot R_2 \quad (14)$$

In this case, since all the transistors have the same characteristics, $$I_{E6}'=I_{B4} \quad (15)$$
$$I_{B7}'=I_{B2} \quad (16)$$

Thus, from the formulae (14), (15) and (16), $$\Delta V=0$$

In the gain-variable amplifier of FIG. 5, the deviation of the DC component of the output voltage $V_{out2}$ depending upon the gain control voltage $V_C$ is zero.

Also, in FIG. 5, the difference in the collector-emitter voltage $V_{CE}$ between the transistors $Q_1$ and $Q_2$ can be reduced by the resistor $R_3$ and the transistor $Q_8$ to minimize the distortion for the smallest gain.

Figure 6:
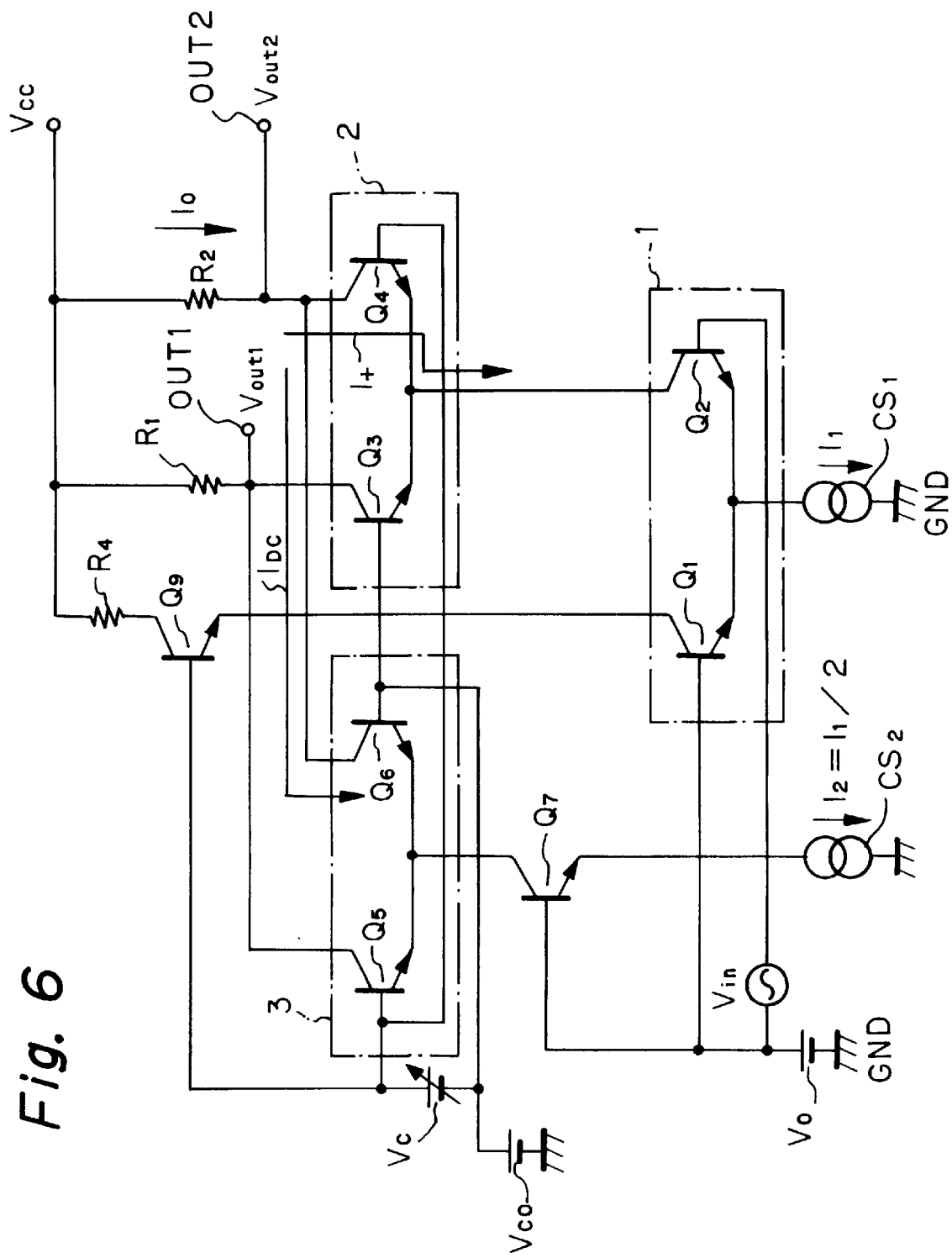
FIG. 6 is a circuit diagram illustrating a second embodiment of the gain-variable amplifier according to the present invention.

In FIG. 6, which illustrates a second embodiment of the present invention, an NPN type transistor $Q_7$ is interposed between the common emitter of the transistors $Q_5$ and $Q_6$ and the constant current source $CS_2$ of FIG. 3. Since the base of the transistor $Q_7$ is connected to the base of the transistor $Q_1$, the transistor $Q_7$ corresponds to the transistor $Q_1$. Also, a load resistor $R_1$ is interposed between the power supply terminal $V_{CC}$ and the collector of the transistor $Q_3$ of FIG.

3. The load resistor $R_1$ provides a negative phase output voltage $V_{out1}$ at an output terminal OUT1, while the load resistor $R_2$ provides a positive phase output voltage $V_{out2}$ at an output terminal OUT2.

Further, a load resistor $R_4$ and an NPN type transistor $Q_9$ are connected in series between the power supply terminal $V_{CC}$ and the collector of the transistor $Q_1$ of FIG. 3. Since the base of the transistor $Q_9$ is connected to the base of the transistor $Q_4$ and $Q_5$, the load resistor $R_4$ and the transistor $Q_9$ correspond to the Load resistor $R_2$ and the transistor $Q_4$ (or $Q_5$), respectively.

The gain characteristics of the gain-variable amplifier of FIG. 6 are also the same as those of the gain-variable amplifier of FIG. 3 as shown in FIG. 4.

Also, the DC output characteristics of the gain-variable amplifier of FIG. 6 are the same as those of the gain-variable amplifier of FIG. 5. That is, the in the gain-variable amplifier of FIG. 6, the deviation of the DC component of the output voltage $V_{out2}$ depending upon the gain control voltage $V_C$ is zero.

Also, in FIG. 6, the difference in the collector-emitter voltage $V_{CE}$ between the transistors $Q_1$ and $Q_2$ can be reduced by the resistor $R_4$ and the transistor $Q_9$ to minimize the distortion for the largest gain.

Figure 7:
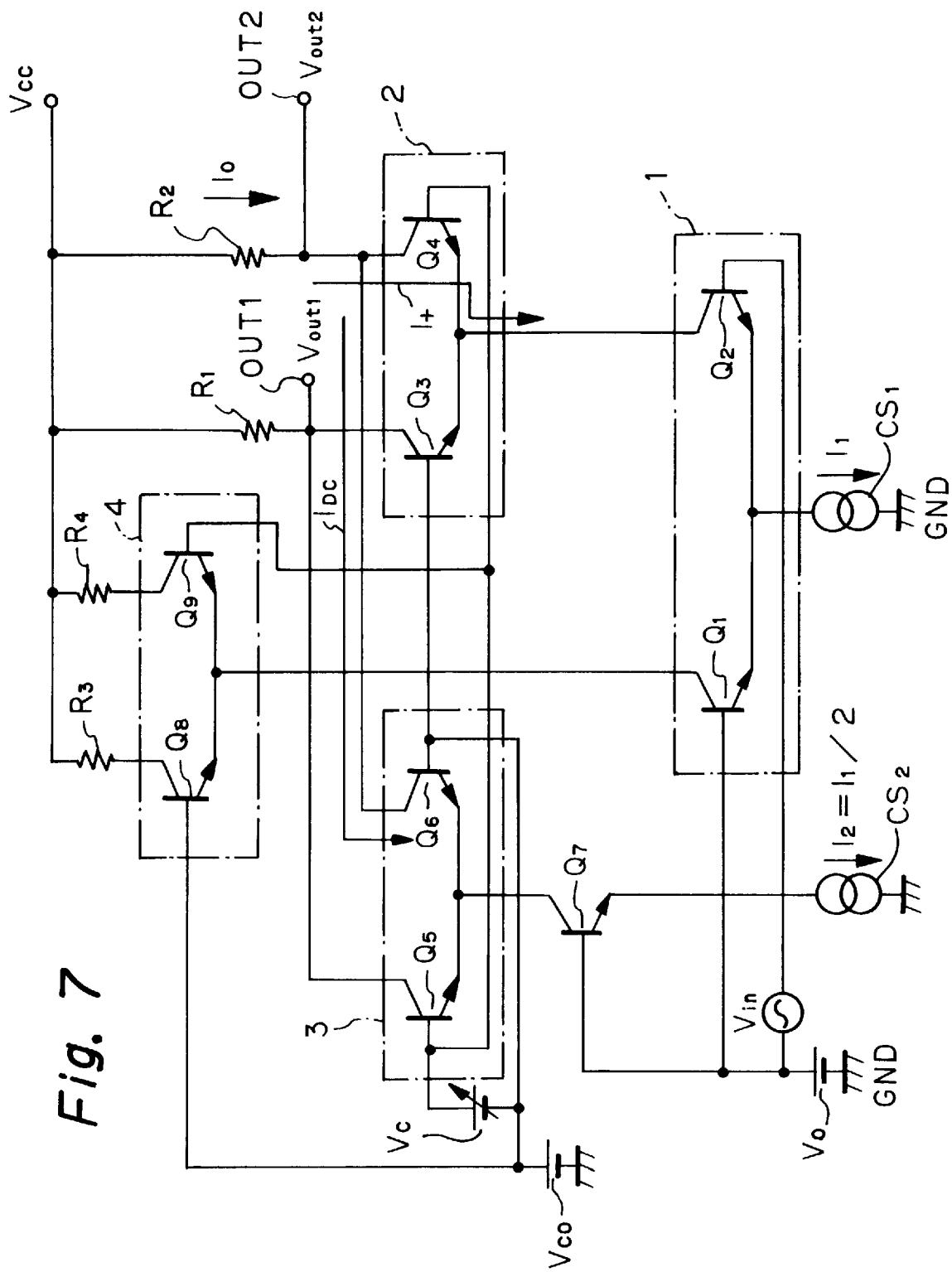
FIG. 7 is a circuit diagram illustrating a third embodiment of the gain-variable amplifier according to the present invention.

In FIG. 7, which illustrates a third embodiment of the present invention, the first embodiment as illustrated in FIG. 5 is combined with the second embodiment as illustrated in FIG. 6. In this case, the transistors $Q_8$ and $Q_9$ form a differential amplifier 4.

The gain characteristics of the gain-variable amplifier of FIG. 7 are also the same as those of the gain-variable amplifier of FIG. 3 as shown in FIG. 4.

Also, the DC output characteristics of the gain-variable amplifier of FIG. 7 are the same as those of the gain-variable amplifier of FIGS. 5 and 6. That is, the in the gain-variable amplifier of FIG. 7, the deviation of the DC component of the output voltage $V_{out2}$ depending upon the gain control voltage $V_C$ is zero.

Also, in FIG. 7, the difference in the collector-emitter voltage $V_{CE}$ between the transistors $Q_1$ and $Q_2$ can be reduced by the resistors $R_3$ and $R_4$ and the transistors $Q_6$ and $Q_9$ to minimize the distortion regardless of the gain.

Figure 8:
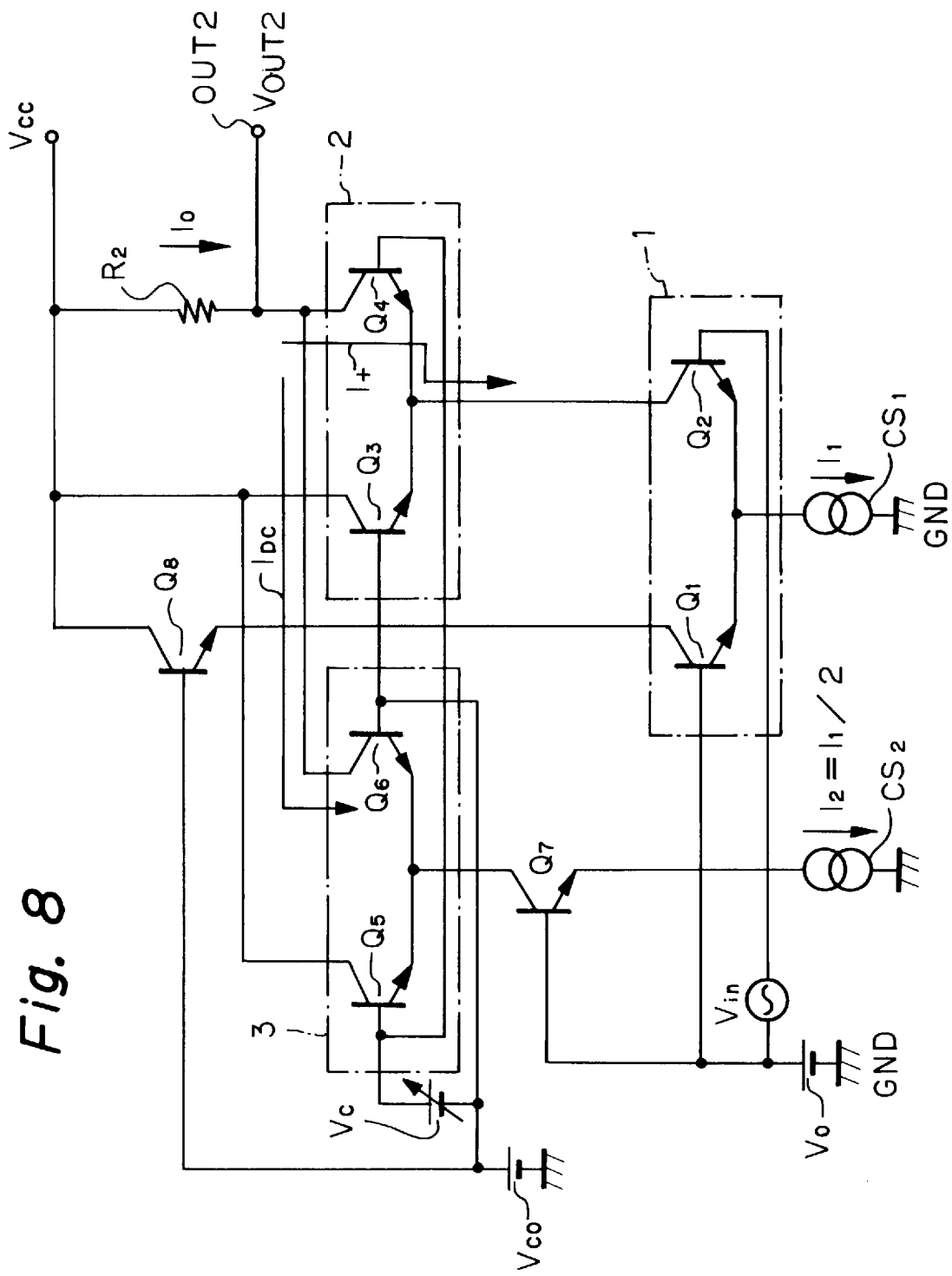
FIGS. 8, 9, 10 are circuit diagrams of modifications of the gain-variable amplifiers of FIGS. 5, 6 and 7, respectively.
Figure 9:
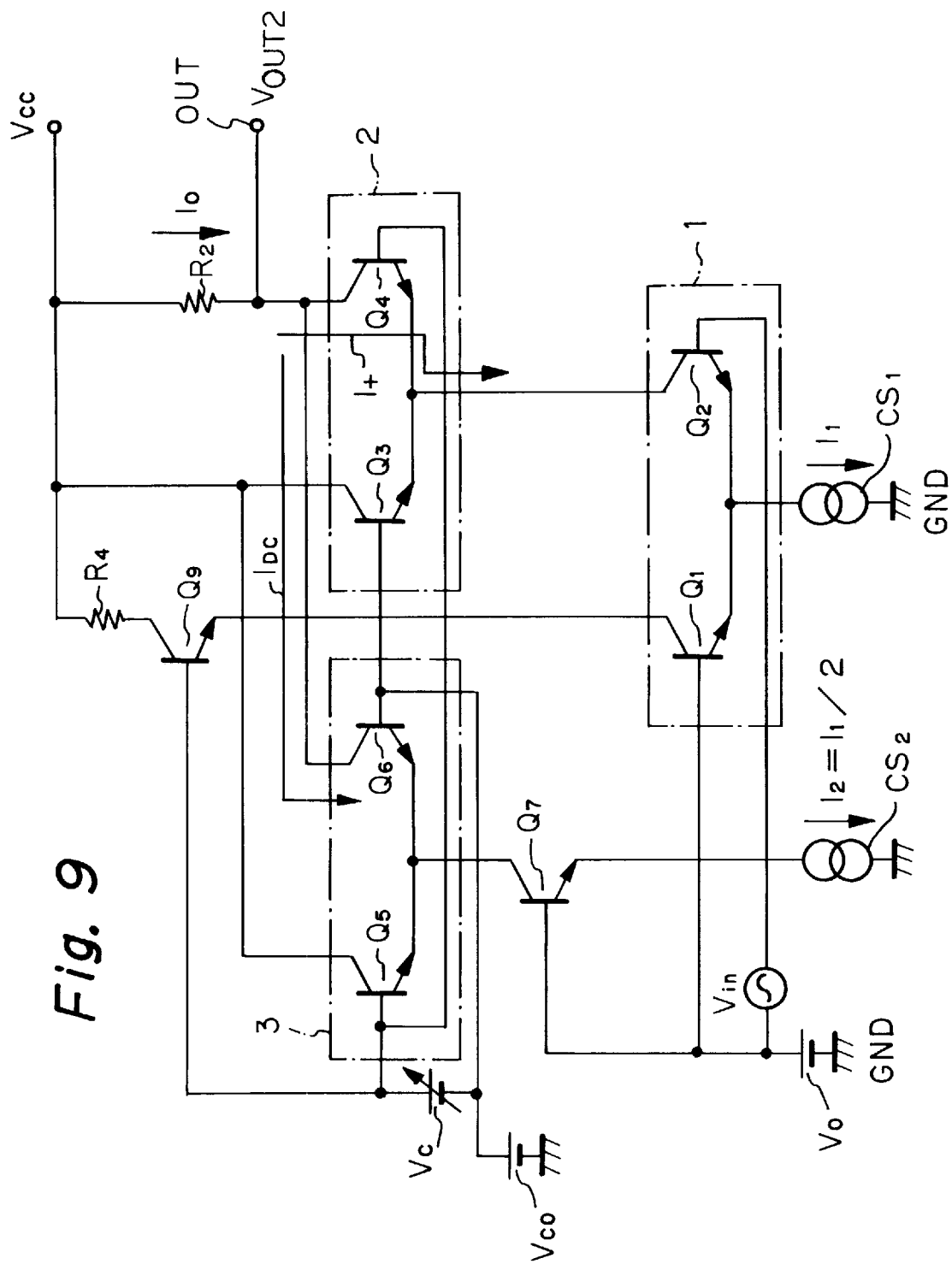
Figure 10:
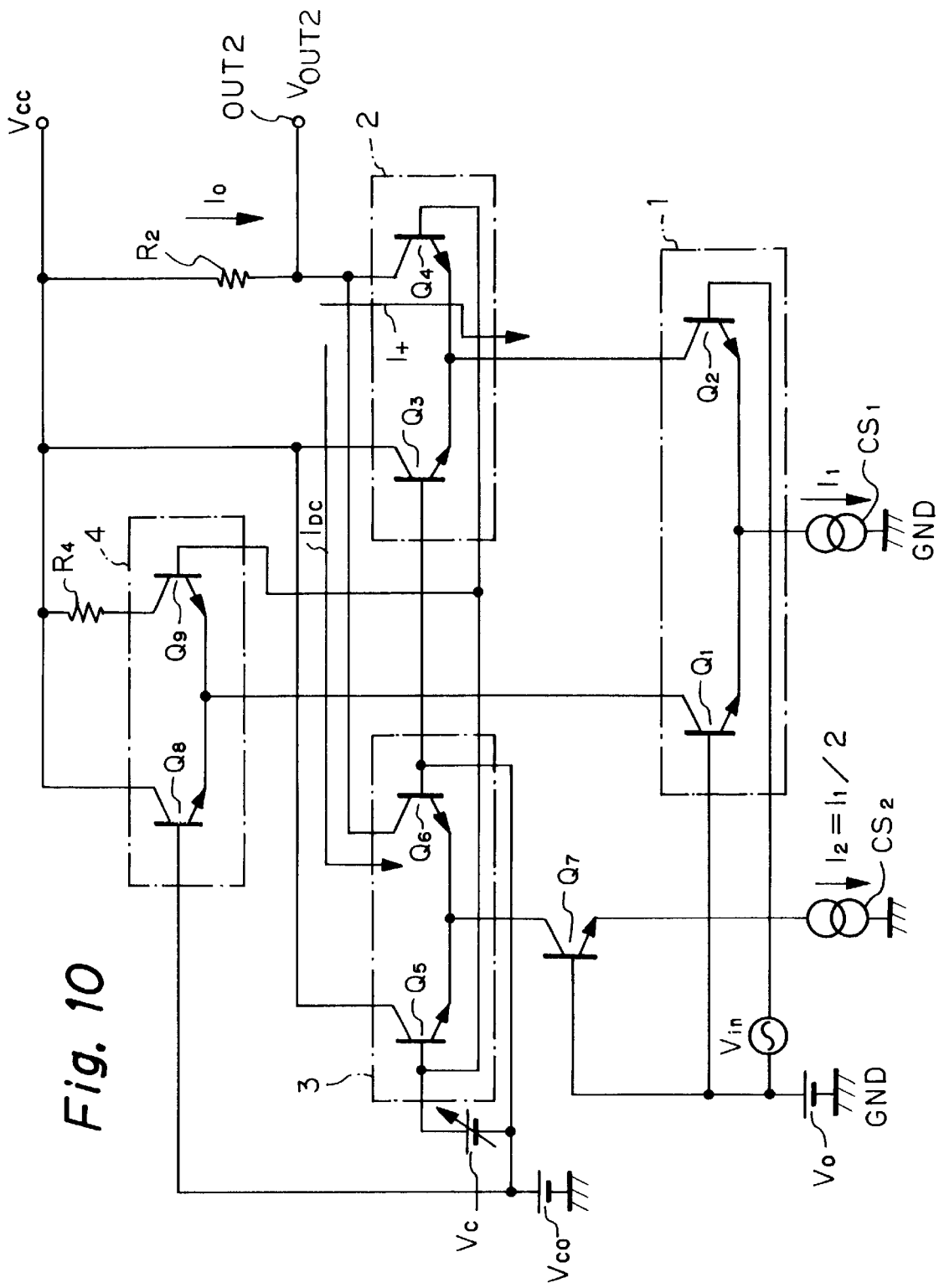
Figure 11:
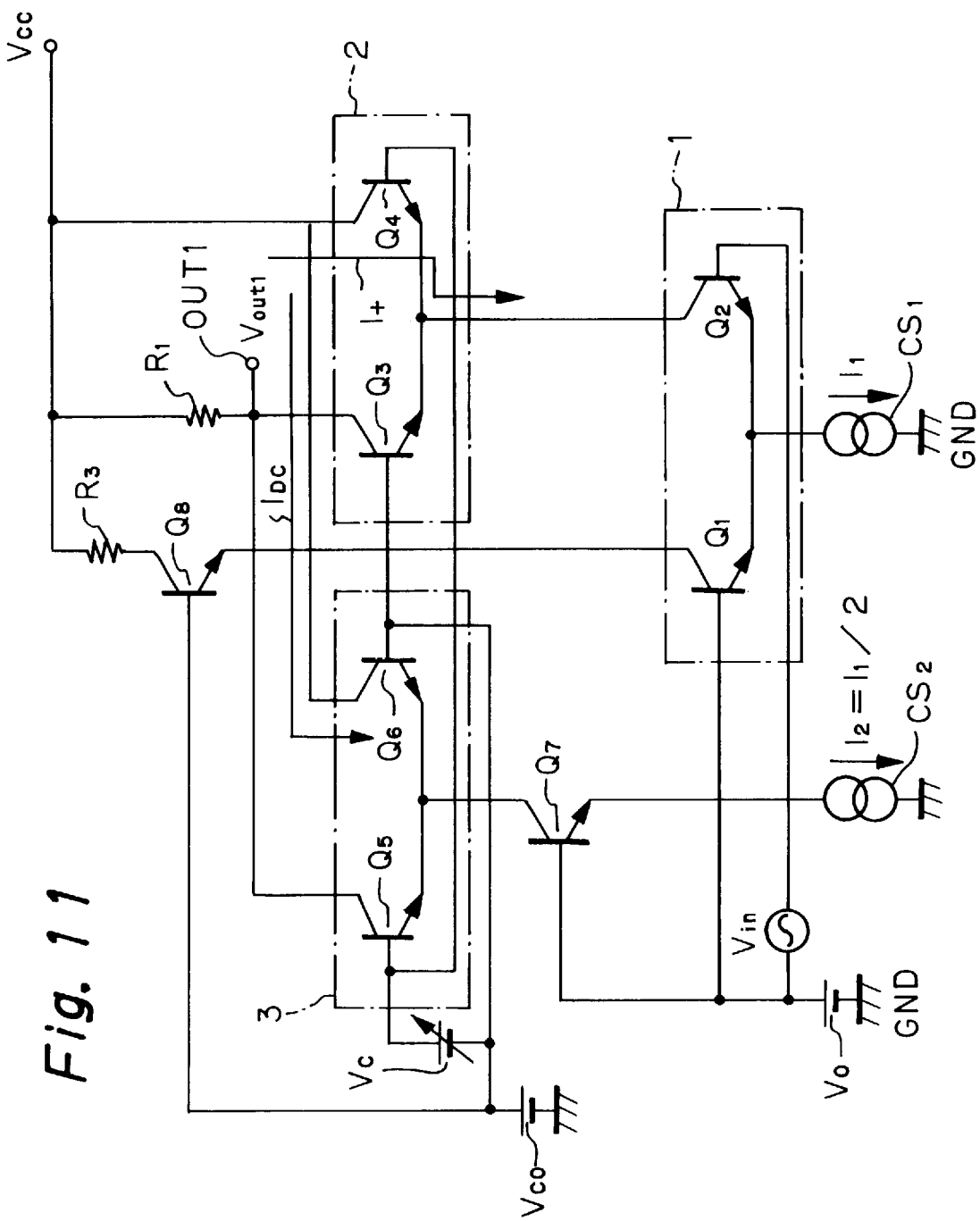
FIGS. 11, 12 and 13 are circuit diagrams of other modifications of the gain-variable amplifiers of FIGS. 5, 6 and 7, respectively.
Figure 12:
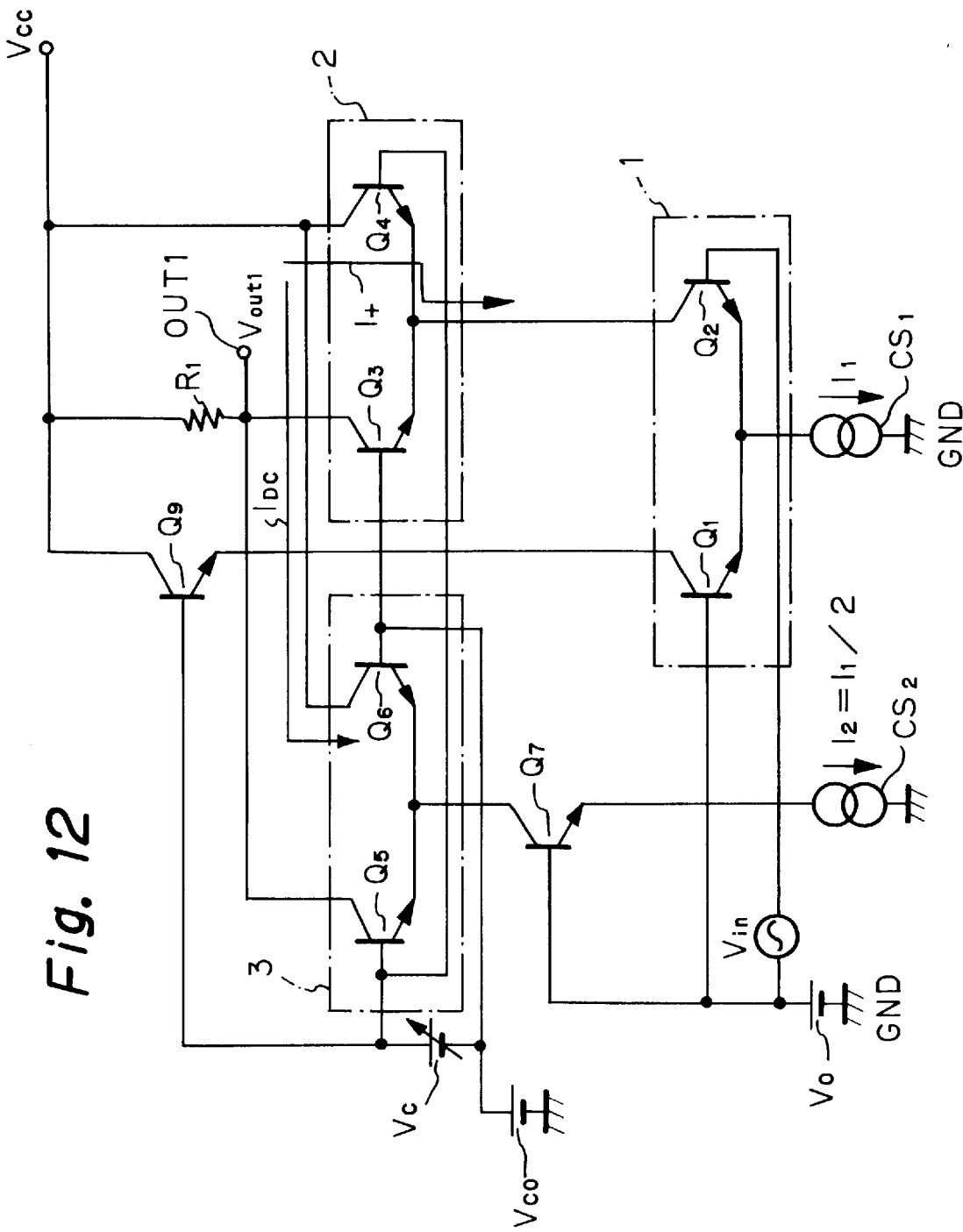
Figure 13:
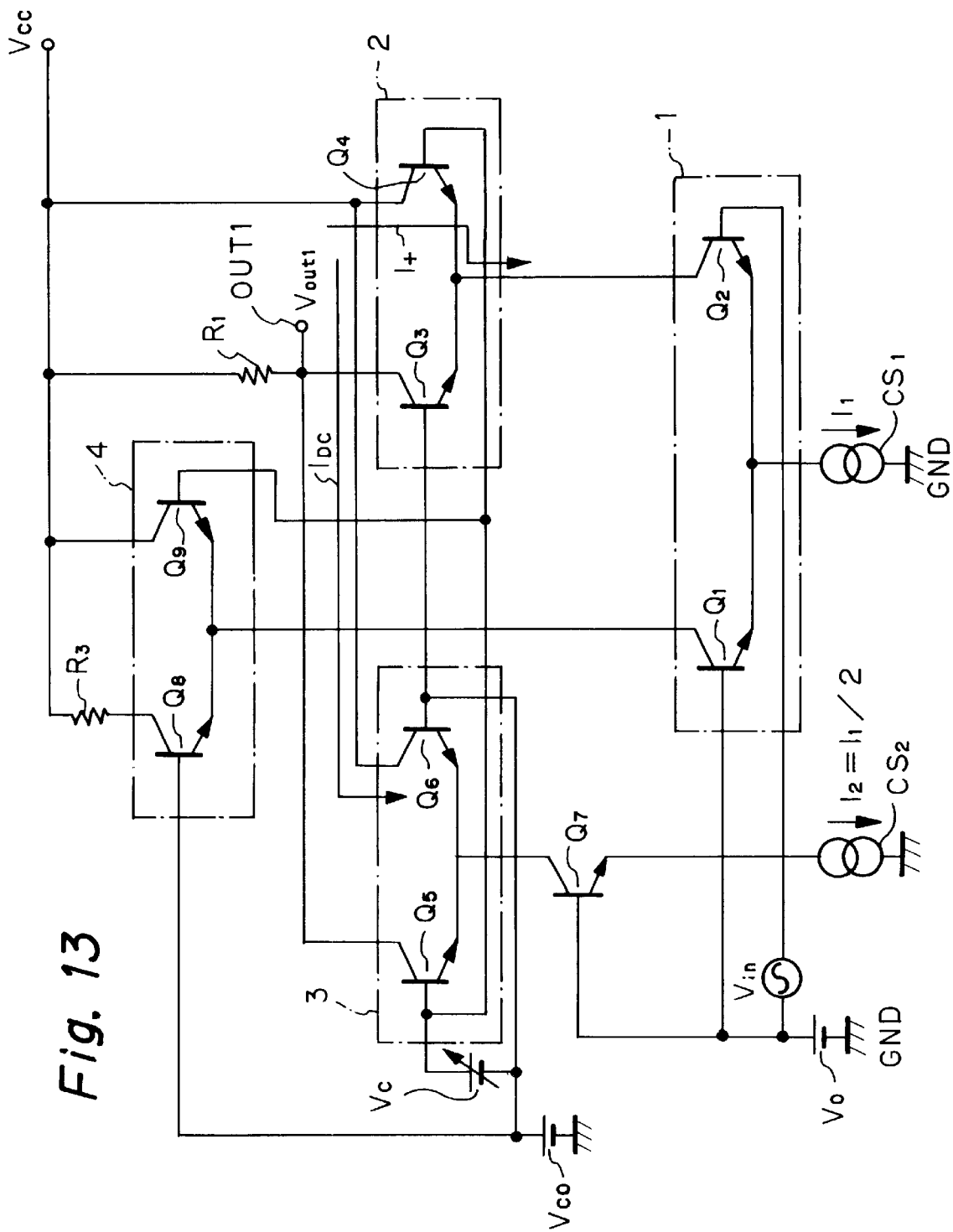

In the above-described embodiments, the negative phase output voltage $V_{out1}$ and the positive phase output voltage $V_{out2}$ are both utilized. However, if only the negative phase voltage $V_{out1}$ is utilized, the gain-variable amplifiers of FIGS. 5, 6 and 7 can be modified into circuits as illustrated in FIGS. 11, 12 and 13. In FIG. 11, the load resistors $R_1$ and $R_3$ of FIG. 5 are deleted; in FIG. 12, the load resistor $R_1$ of FIG. 6 is deleted; and in FIG. 13, the load resistors $R_1$ and $R_3$ are deleted. On the other hand, if only the positive phase voltage $V_{out2}$ is utilized, the gain-variable amplifiers of FIGS. 5, 6 and 7 can be modified into circuits as illustrated in FIGS. 8, 9 and 10. In FIG. 8, the load resistor $R_2$ of FIG. 5 is deleted; in FIG. 9, the load resistors $R_2$ and $R_4$ of FIG. 6 are deleted; and in FIG. 10, the load resistors $R_2$ and $R_4$ are deleted.

As explained hereinabove, according to the present invention, the deviation of the DC output characteristics can be reduced, and also, the distortion by the difference in the collector-emitter voltage between the input transistors can be reduced.

I claim:

1. A gain-variable amplifier comprising:

first and second power supply terminals;

first and second constant current sources connected to said first power supply terminal;

a first differential amplifier formed by first and second transistors having a common emitter connected to said first constant current source, said first differential amplifier amplifying an input voltage;

a second differential amplifier formed by third and fourth transistors having a common emitter connected to a collector of said second transistor, respectively;

a third differential amplifier formed by fifth and sixth transistors having a common emitter, collectors of said fifth and sixth transistors being connected to collectors of said third and fourth transistors, respectively;

a seventh transistor connected between the common emitter of said fifth and sixth transistors and said second constant current source;

a first load resistor connected between a collector of said third transistor and said second power supply terminal;

a second load resistor connected to said second power supply terminal; and an eighth transistor connected between said second load resistor and the collector of said first transistor, a base of said eighth transistor receiving said first control voltage, a collector of said first transistor being connected to said second power supply terminal, a collector of said fourth transistor being connected to said second power supply terminal, bases of said third and sixth transistors being connected for receiving a second control voltage, a base of said seventh transistor being connected to a base of said first transistor.

2. The gain-variable amplifier as set forth in claim 1, further comprising a third load resistor connected between the collector of said fourth transistor and said second power supply terminal.

3. The gain-variable amplifier as set forth in claim 2, further comprising:

a fourth load resistor connected to said second power supply terminal; and a ninth transistor connected between the collector of said first transistor and said fourth load resistor.

4. The gain-variable amplifier as set forth in claim 1, further comprising a ninth transistor connected between the collector of said first transistor and said second power supply terminal.

5. A gain-variable amplifier comprising:

first and second power supply terminals;

first and second constant current sources connected to said first power supply terminal;

a first differential amplifier formed by first and second transistors having a common emitter connected to said first constant current source, said first differential amplifier amplifying an input voltage;

a second differential amplifier formed by third and fourth transistors having a common emitter connected to a collector of said second transistor;

a third differential amplifier formed by fifth and sixth transistors having a common emitter, collectors of said fifth and sixth transistors being connected to collectors of said third and fourth transistors;

a seventh transistor connected between the common emitter of said fifth and sixth transistors and said second constant current source;

a first load resistor connected between a collector of said fourth transistor and said second power supply terminal;

a second load resistor connected to said second power supply terminal; and an eighth transistor connected between said third load register and the collector of said first transistor, a base of said eighth transistor receiving said second control voltage, a collector of said first transistor being connected to said second power supply terminal, a collector of said third transistor being connected to said second power supply terminal, bases of said third and sixth transistors being connected for receiving a first control voltage, bases of said fourth and fifth transistors being connected for receiving a second control voltage, a base of said seventh transistor being connected to a base of said first transistor.

6. The gain-variable amplifier as set forth in claim 5, further comprising a third load resistor connected between the collector of said third transistor and said second power supply terminal.

7. The gain-variable amplifier as set forth in claim 6, further comprising:

a fourth load resistor connected to said second power supply terminal; and a ninth transistor connected between the collector of said first transistor and said fourth load resistor.

8. The gain-variable amplifier as set forth in claim 5, further comprising a ninth transistor connected between the collector of said first transistor and said second power supply terminal.

9. A gain-variable amplifier comprising:

first and second constant current sources;

a first differential amplifier circuit for receiving an input voltage, said first differential amplifier circuit having an input connected to said first current source and first and second outputs;

a second differential amplifier circuit having an input connected to said second output and third and fourth outputs, respectively;

a third differential amplifier circuit having an input, and fifth and sixth outputs connected to said third and fourth outputs;

a first transistor connected between said second constant current source and the input of said third differential amplifier circuit, said second and third differential amplifier circuits being controlled by a gain control voltage; and a second transistor connected to said first output and controlled by said gain control voltage.

10. The gain-variable amplifier as set forth in claim 9, further comprising a load resistor connected to said second transistor.

11. A gain-variable amplifier comprising:

first and second power supply terminals;

first and second constant current sources connected to said first power supply terminal;

a first differential amplifier formed by first and second transistors having a common emitter connected to said first constant current source, said first differential amplifier amplifying an input voltage;

a second differential amplifier formed by third and fourth transistors having a common emitter connected to a collector of said second transistor, respectively;

a third differential amplifier formed by fifth and sixth transistors having a common emitter, collectors of said fifth and sixth transistors being connected to collectors of said third and fourth transistors, respectively;

a seventh transistor connected between the common emitter of said fifth and sixth transistors and said second constant current source;

a first load resistor connected between a collector of said third transistor and said second power supply terminal;

an eighth transistor connected between the collector of said first transistor and said second power supply terminal;

a collector of said fourth transistor being connected to said second power supply terminal;

bases of said third and sixth transistors being connected for receiving a control voltage; and a base of said seventh transistor being connected to a base of said first transistor.

12. The gain-variable amplifier as set forth in claim 11, further comprising a second load resistor connected between the collector of said fourth transistor and said second power supply terminal.

13. The gain-variable amplifier as set forth in claim 12, further comprising:

a third load resistor connected to said second power supply terminal; and a ninth transistor connected between the collector of said first transistor and said third load resistor.

14. The gain-variable amplifier as set forth in claim 11, further comprising:

a second load resistor connected to said second power supply terminal;

a ninth transistor connected between said second load resistor and the collector of said first transistor, a base of said ninth transistor receiving said first control voltage.

15. A gain-variable amplifier comprising:

first and second power supply terminals;

first and second constant current sources connected to said first power supply terminal;

a first differential amplifier formed by first and second transistors having a common emitter connected to said first constant current source, said first differential amplifier amplifying an input voltage;

a second differential amplifier formed by third and fourth transistors having a common emitter connected to a collector of said second transistor, respectively;

a third differential amplifier formed by fifth and sixth transistors having a common emitter, collectors of said fifth and sixth transistors being connected to collectors of said third and fourth transistors, respectively;

a seventh transistor connected between the common emitter of said fifth and sixth transistors and said second constant current source;

a first load resistor connected between a collector of said third transistor and said second power supply terminal;

a second load resistor connected between the collector of said fourth transistor and said second power supply terminal;

a third load resistor connected to said second power supply terminal;

an eighth transistor connected between the collector of said first transistor and said third load resistor;

bases of said third and sixth transistors being connected for receiving a control voltage; and a base of said seventh transistor being connected to a base of said first transistor.

16. A gain-variable amplifier comprising:

first and second power supply terminals;

first and second constant current sources connected to said first power supply terminal;

a first differential amplifier formed by first and second transistors having a common emitter connected to said first constant current source, said first differential amplifier amplifying an input voltage;

a second differential amplifier formed by third and fourth transistors having a common emitter connected to a collector of said second transistor;

a third differential amplifier formed by fifth and sixth transistors having a common emitter, collectors of said fifth and sixth transistors being connected to collectors of said third and fourth transistors;

a seventh transistor connected between the common emitter of said fifth and sixth transistors and said second constant current source;

a first load resistor connected between a collector of said fourth transistor and said second power supply terminal;

an eighth transistor connected between the collector of said first transistor and said second power supply terminal;

a collector of said third transistor being connected to said second power supply terminal;

bases of said third and sixth transistors being connected for receiving a first control voltage;

bases of said fourth and fifth transistors being connected for receiving a second control voltage; and a base of said seventh transistor being connected to a base of said first transistor.

17. The gain-variable amplifier as set forth in claim 16, further comprising a second load resistor connected between the collector of said eighth transistor and said second power supply terminal.

18. The gain-variable amplifier as set forth in claim 17, further comprising:

a third load resistor connected to said second power supply terminal; and a ninth transistor connected between the collector of said first transistor and said third load resistor.

19. The gain-variable amplifier as set forth in claim 20, further comprising a second load resistor connected to said second power supply terminal;

a ninth transistor connected between said second load resistor and the collector of said first transistor, a base of said ninth transistor receiving said second control voltage.

20. A gain-variable amplifier comprising:

first and second constant current sources;

a first differential amplifier circuit for receiving an input voltage, said first differential amplifier circuit having an input connected to said first current source and first and second outputs;

a second differential amplifier circuit having an input connected to said second output and third and fourth outputs, respectively;

a third differential amplifier circuit having an input, and fifth and sixth outputs connected to said third and fourth outputs;

a first transistor connected between said second constant current source and the input of said third differential amplifier circuit, said second and third differential amplifier circuits being controlled by a gain control voltage;

a fourth differential amplifier circuit having an input connected to said first output, said fourth differential amplifier circuit being controlled by said gain control voltage.

21. The gain-variable amplifier as set forth in claim 20, further comprising a load resistor connected to one of outputs of said fourth differential amplifier circuit.

* * * * *